United States Patent [19]
Kim et al.

[11] Patent Number: 5,874,847
[45] Date of Patent: Feb. 23, 1999

[54] CHARGE PUMP CIRCUIT FOR CONTROLLING A PAIR OF DRIVE TRANSISTORS

[75] Inventors: Yong-Ho Kim, Seoul; Byoung-Own Min, Inchon, both of Rep. of Korea

[73] Assignee: Samsung Electronics, Co., Ltd., Suwon, Rep. of Korea

[21] Appl. No.: 748,213

[22] Filed: Nov. 12, 1996

[30] Foreign Application Priority Data

Nov. 9, 1995 [KR] Rep. of Korea ................... 1995 40560

[51] Int. Cl.[6] ...................................................... H03K 17/16
[52] U.S. Cl. .......................... 327/390; 327/589; 318/293
[58] Field of Search ................................... 327/390, 536, 327/589, 537, 110; 318/293

[56] References Cited

U.S. PATENT DOCUMENTS

| | | | |
|---|---|---|---|
| 4,443,714 | 4/1984 | Nakano et al. | 327/589 |
| 4,636,657 | 1/1987 | Reddy | 327/589 |
| 4,705,997 | 11/1987 | Juzswik | 318/293 |
| 5,268,600 | 12/1993 | Yeu | 327/589 |
| 5,600,216 | 2/1997 | Karwath et al. | 318/293 |

*Primary Examiner*—Timothy P. Callahan
*Assistant Examiner*—Jung Ho Kim
*Attorney, Agent, or Firm*—Marger, Johnson, McCollom, P.C.

[57] ABSTRACT

A charge pump circuit for charging/pumping charge into/out of a charge pumping capacitor. Charge is pumped from the capacitor to turn on one of a pair of MOSFET transistors formed in an integrated circuit for driving a load. The MOSFET transistors are connected at a node in series with one another. The charging capacitor has one end connected at the node and the other connected through a diode to one side of a power supply which is also applied across both transistors. An input signal turns the MOSFETs on and off in a complementary fashion. Each MOSFET has a gate which is discharged to ground when the MOSFET is turned off. A zener diode prevents the capacitor from pumping excess charge to the gate of the MOSFET to which it is connected. Another zener diode prevents damage resulting from excessive voltage external to the integrated circuit.

8 Claims, 4 Drawing Sheets

CHARGE PUMP CIRCUIT FOR CONTROLLING A PAIR OF DRIVE TRANSISTORS

FIELD OF THE INVENTION

The present invention relates to a charge pump circuit for controlling a pair of drive transistors and more particularly to a charge pump circuit for pumping electric charge out of a capacitor to a semiconductor integrated circuit having at least two drive transistors for driving a load.

BACKGROUND OF THE INVENTION

Prior art charge pump circuits have been provided on a semiconductor chip to generate a higher voltage using an on-chip power supply voltage. Most of such conventional charge pump circuits utilizes a switching method of high frequency oscillation. Such a charge pump circuit is illustrated in FIG. 1.

As shown in FIG. 1, the above charge pump circuit has a charge pumping capacitor CP, an oscillation circuit 10 connected between an on-chip voltage source Vcc and a ground. Circuit 10 pumps electric charge out of the capacitor at a rate dependent upon the oscillation frequency. A power supply circuit 20 generates another voltage in response to voltage levels of an input signal Vin to always maintain a constant voltage at a connection point P1 between the capacitor CP and the output of the power supply part 20. A MOSFET (metal oxide field effect transistor) drives a load circuit 50 and a constant current source 30 supplys a constant current to a control terminal (i.e., a gate terminal) of the MOSFET.

The oscillation circuit 10 has two switching elements 12 and 13 which are operated complementary to one another. If the switching element 12 is switched on and switching element 13 is off, the on-chip voltage is applied through the switching element 12 to the capacitor CP thus charging the capacitor CP. If not, i.e., when the switching element 13 is switched on and switching element 12 is off, the capacitor CP is discharged through the switching element 13 to ground. When the on-chip voltage is applied through switching element 12 to the capacitor CP at the point P1, a voltage of about Vcc+12 V is maintained. This is because a voltage of 12 V is applied via the MOSFET 21 to the point P1 by means of the MOSFET 21 to be activated in response to the input signal V1.

As described above, a conventional charge pump circuit requires a high frequency oscillating circuit to charge or discharge the capacitor CP.

SUMMARY OF THE INVENTION

It is therefore an object of the present invention to provide a charge pump circuit for pumping electric charge out of a charge pumping capacitor to a circuit without the use of a high frequency oscillating circuit.

It is an additional object of the present invention to provide a charge pump circuit for a semiconductor integrated circuit having at least two MOS transistors which are not simultaneously activated.

It is another object of the present invention to provide a charge pump circuit which eliminates an externally applied dump voltage so as to protect circuit elements therein.

It is a further object of the present invention to provide a charge pump circuit which can be built on an integrated circuit.

According to one aspect of the present invention, a control circuit for a direct current load includes a power supply having first and second power supply terminals across which a power supply potential is developed. First and second drive transistors are connected at a first node in series with one another and second and third drive transistors are connected at a second node in series with one another. The load is connected between the first and second nodes and the power supply potential is applied across both of the first and second transistors and both of the third and fourth transistors. A charge pump capacitor has a first side connected to said first node and a second side operatively connected to a control terminal of said first transistor and to the first power supply terminal. An input terminal is operatively connected to the first transistor control terminal and to a control terminal on the second transistor. The first and second transistors are switched complementary to one another responsive to an input signal on said input terminal.

In another aspect of the present invention includes a method for complementary switching of first and second drive transistors connected at a node in series with one another comprising. A charge pump capacitor has one side connected to the node. A power supply voltage is applied across both transistors. The first transistor is turned off and the second transistor turned on thereby placing one side of the capacitor in common with a first side of the power supply. A second side of the power supply is applied to the other side of the capacitor thereby charging the capacitor. The first transistor is turned on and the second transistor turned off. Charge from the capacitor is pumped to a control terminal of the first transistor.

The foregoing and other objects, features and advantages of the invention will become more readily apparent from the following detailed description of a preferred embodiment which proceeds with reference to the drawings.

DETAILED DESCRIPTION OF THE EMBODIMENTS

Figure 1:
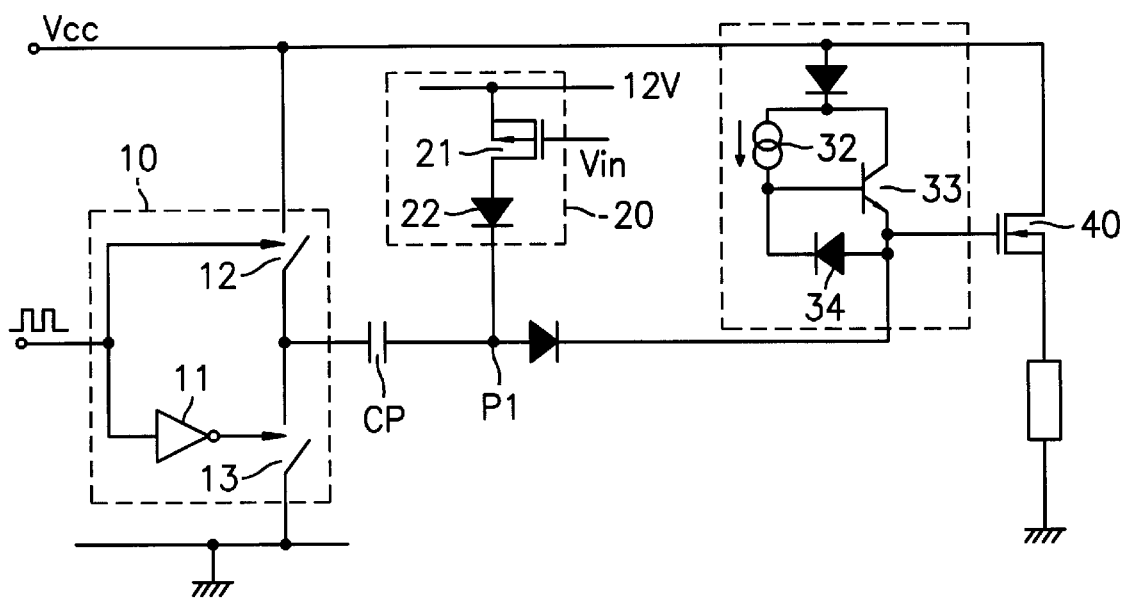
FIG. 1 is a circuit diagram of a conventional charge pump circuit.
Figure 2:
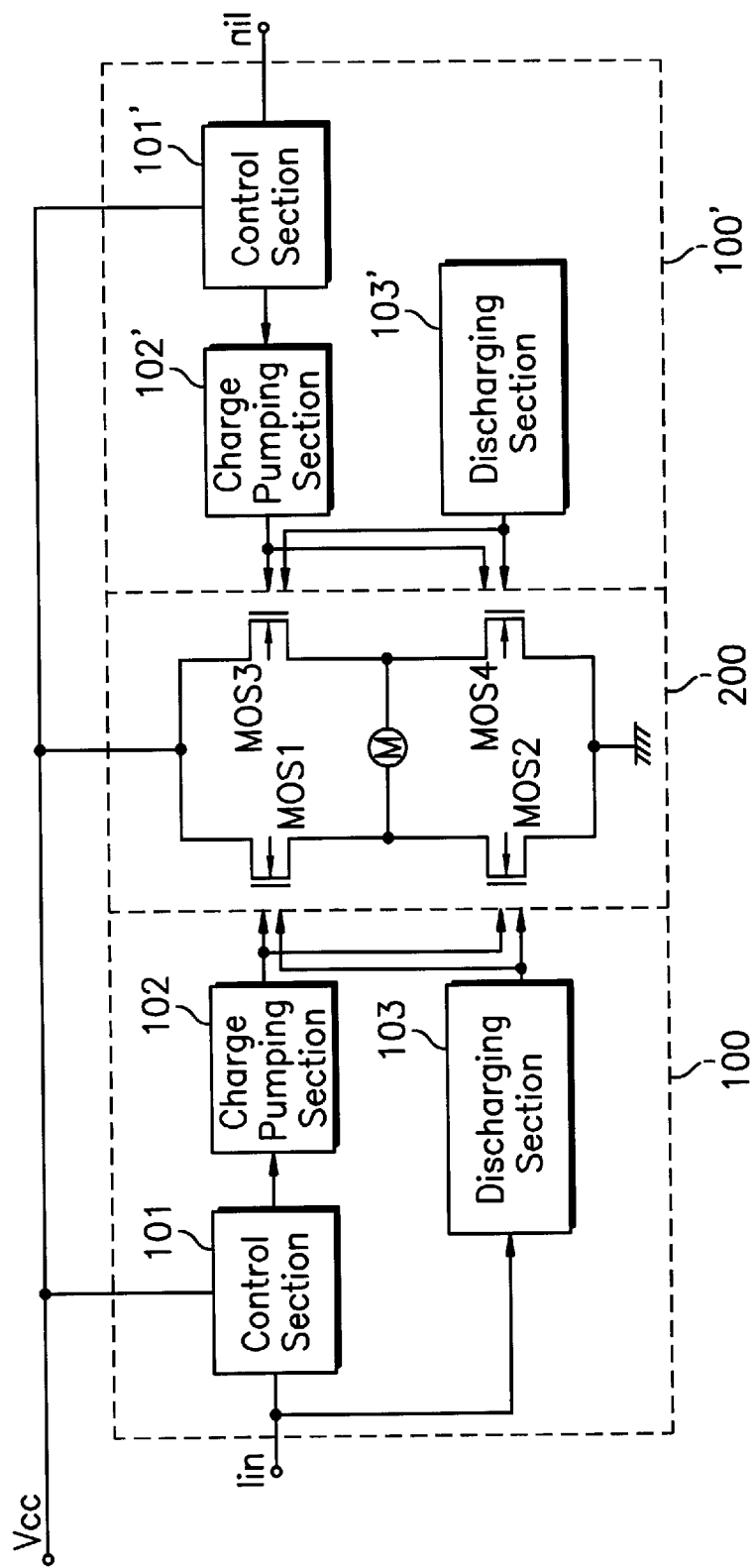
FIG. 2 is a block diagram of a novel charge pump circuit for driving MOS transistors in accordance with the present invention.
Figure 3:
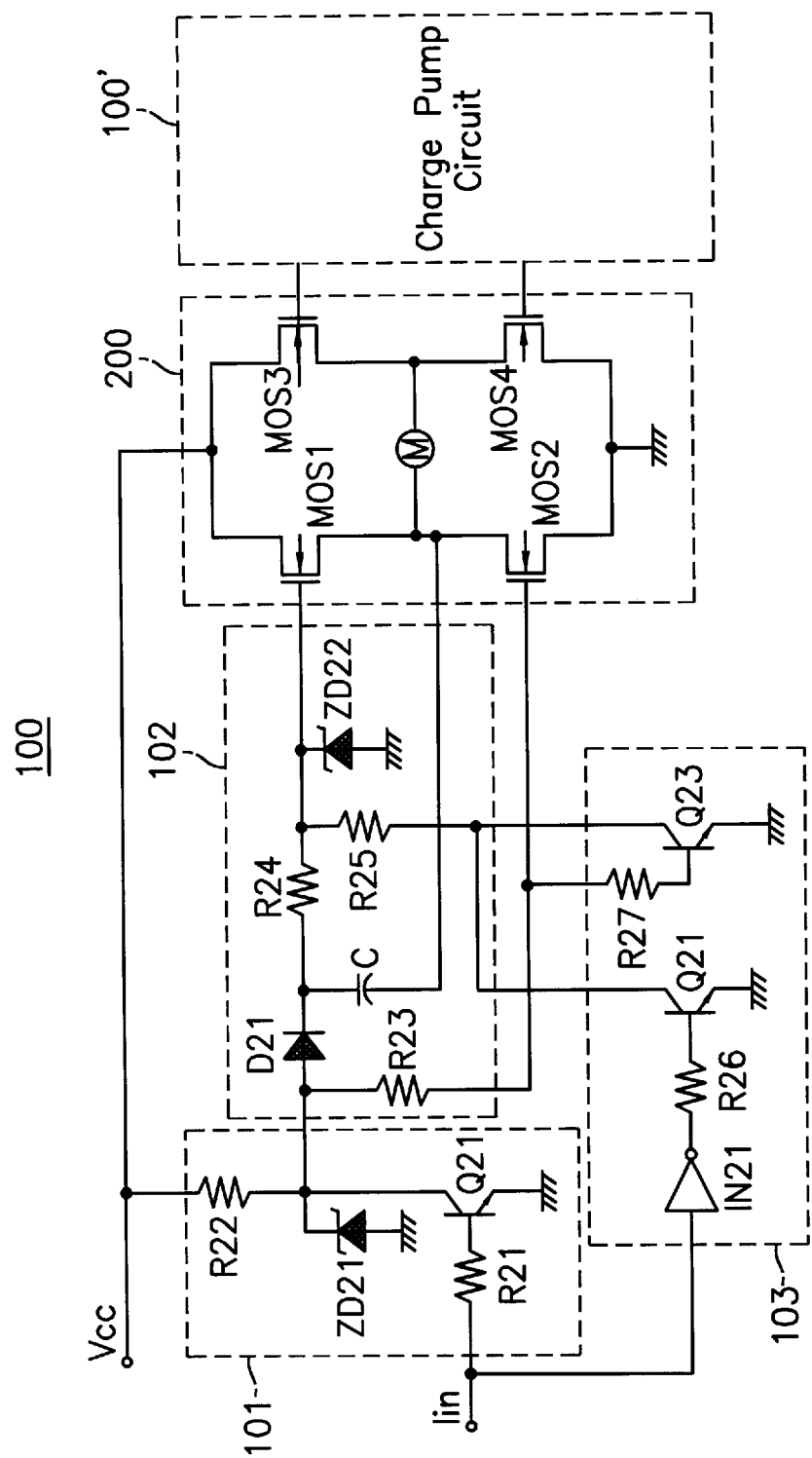
FIG. 3 is a detailed circuit diagram illustrating an example of the novel charge pump circuit shown in FIG. 2.

Referring to FIGS. 2 and 3, a novel charge pump circuit 100 for driving MOS transistors in accordance with the invention is provided to supply a pumped charge out of a charge pumping capacitor C, in a charge pumping section 102, to an output driver 200 having at least two MOS transistors which are selectively activated for driving a load M. The output driver 200 is coupled between a power source Vcc, an on-chip voltage source in the present embodiment of the invention, and a ground. Driver 200 is provided with at least four MOS transistors MOS1 through MOS4. Of the transistors MOS1 through MOS4, two MOS transistors MOS1 and MOS3 are provided to achieve a first control of the output driver 200 and the others MOS2 and MOS4 to drive a second control thereof. Herein, if the load M is a motor, the first control of the output driver 200 is driving the motor in one direction and the second control is driving the motor in the other direction. As can be seen, MOS1 and MOS2 must be driven complementary to one another with both driven complementary to MOS3 and MOS4. Charge pump circuit 100 is provided to control the MOS transistors MOS1 and MOS2 of the output driver 200 and the charge pump circuit 100' to control the MOS transistors MOS3 and MOS4 thereof. Since the left and right charge pump circuits 100 and 100' have the same construction, the operation of the circuit 100' is omitted.

Referring again to FIG. 2, the charge pump circuit 100 has a control section 101 which controls an electrical connection of a voltage source Vcc, in FIG. 3, to a ground in response to an input signal Iin of the circuit. Electric charge is then charged into the charge pumping capacitor C or pumped out of it by means of the control section 101. Charge pumping section 102 is provided for pumping electric charge out of the charge pumping capacitor C, in FIG. 3, to the gate of the transistor MOS1, and a discharging section 103 which is provided for discharging a gate voltage of transistor MOS2 to ground during the activation of transistor MOS1, i.e., during the pumping operation of the capacitor C.

FIG. 3 illustrates an example of the novel charge pump circuit shown in FIG. 2. When an input signal Iin of the circuit 100 is at low level, the control section 101 enables charge pumping capacitor C to be charged.

As shown in FIG. 3, when an input signal Iin of low level is applied through a bias resistor R21 to the base of a transistor Q21, the transistor Q21 is off. When transistor Q21 is off, an internal voltage Vcc (on-chip voltage) is applied through bias resistors R22 and R23 to a gate of the transistor MOS2 and also applied through the bias resistor R22 and a diode D21 to the capacitor C. As a result, the capacitor C begins charging and transistor MOS2 is turned on. A zener diode ZD21 is provided between the bias resistor R22 and the collector of the transistor Q21 to eliminate an externally applied dump voltage and thereby protect components of the charge pump circuit 100 from destruction due to the dump voltage.

If the input signal of the circuit is at a high level, control section 101 enables electric charge to be pumped out of the charge pumping capacitor C by means of the charge pumping section 102. With the input signal at a high level, transistor Q21 turns on and thereby a current at a point P2 flows through transistor Q21 to the ground. As a result, the charging operation of capacitor C stops and the stored charge thereof is pumped through a resistor R24 to the gate of transistor MOS1. Therefore, transistor MOS1 turns on responsive to the pumped charge. At the same time transistor MOS2 turns off due to a low level signal at point P2. The gate voltage of transistor MOS1 increases up to about twice Vcc as a result of Vcc being applied to capacitor C through transistor MOS1 after the capacitor is charged to Vcc. This rapidly drives transistor MOS1 to a fully on condition.

As described immediately above, transistors MOS1 and MOS2 are selectively operated. Namely, if one of the MOS transistors is turned on, the other is turned off. Because transistors MOS1 and MOS2 are not simultaneously turned on, due to the presence of a dead time between operation thereof, the elements of the circuit are protected.

The discharging section 103 is provided to discharge a gate voltage of transistor MOS2 during the turning on of transistor MOS1. When the input signal of the charge pump circuit 100 is at high level, transistor MOS1 is turned on, as described above. The high level signal is inverted into a low level by an inventor IN21. The low level signal from the inverter IN21 is applied through a resistor R26 to a base of a transistor Q22. Transistor Q22 is thus turned off as is a transistor Q23 because point P2 is at low level while transistor Q21 is turned on in response to the high level input signal.

As described immediately above, while the input signal Iin is at high level, i.e., during the charging operation of the capacitor C, the gate voltage of transistor MOS2 may be discharged via the resistor R23 and the transistor Q21 to ground.

When the input signal Iin is at a low level, transistor Q22 turns on in response to a high level signal from the inventor IN21 and transistor Q23 also turns on because the point P2 is at a high level while transistor Q21 is off in response to the low level input signal. Thus, the gate voltage of transistor MOS1 is rapidly discharged through both of transistors Q22 and Q23 to ground.

As shown again in FIG. 3, a zener diode ZD22 is provided to prevent an over-voltage from being applied to the gate voltage of transistor MOS1 during a pumping operation of the capacitor C. The charge pump circuit of the first example may be integrated in a semiconductor with the exception of the charge pumping capacitor C and the output driver 200.

Also, since the charge pump circuit has a zener diode for intercepting an externally applied dump voltage, it is protected from any dump voltage which may occur.

Figure 4:
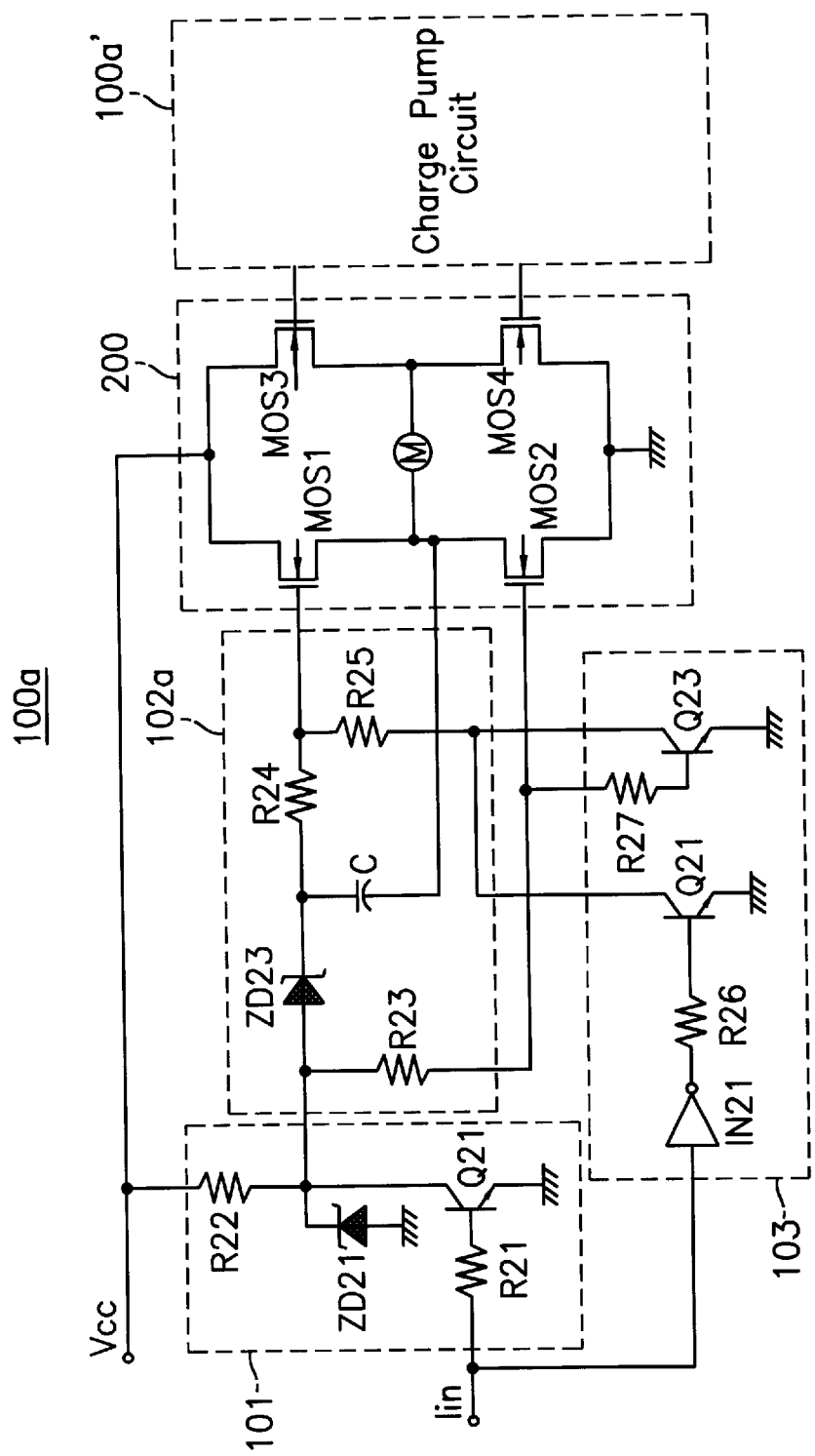
FIG. 4 is a detailed circuit illustrating another example of the novel charge pump circuit shown in FIG. 2.

FIG. 4 illustrates another example of the novel charge pump circuit shown in FIG. 2. The novel charge pump circuit of FIG. 4 has the same construction as that of FIG. 3 except that the additional zener ZD22 is omitted in the charge pumping section 102 and a zener diode ZD23 is substituted for the diode D21 between the point P2 and the charge pumping capacitor C in FIG. 3.

Similar to zener diode ZD22 of the first example (shown in FIG. 3), zener diode ZD23 in FIG. 3 is provided to prevent an over-voltage from being applied to the gate voltage of transistor MOS1 during a pumping operation of capacitor C.

The charge pump circuit of FIG. 4 may be integrated in a semiconductor with the exception of the charge pumping capacitor C and the output driver 200. Because the two MOS transistors of the output driver 200 are driven by the charge pump circuit 100 of FIG. 4, they are not simultaneously turned on due to the presence of a dead time between operation thereof, and the elements of the circuit are protected.

In addition, the charge pump circuit is protected from the occurrence of a dump voltage by a zener diode for cutting off any externally applied dump voltage.

What is claimed is:

1. A control circuit for a direct current load comprising:

a power supply having first and second power supply terminals across which a power supply potential is developed;

first and second drive transistors connected at a first node in series with one another;

third and fourth drive transistors connected at a second node in series with one another, said load being connected between said first and second nodes and said power supply potential being applied across both of said first and second transistors and both of said third and fourth transistors;

a charge pump capacitor having a first side connected to said first node and a second side operatively connected to a control terminal of said first transistor and to said first power supply terminal; and an input terminal operatively connected to said first transistor control terminal and to a control terminal on said second transistor, said first and second transistors being switched complementary to one another responsive to an input signal on said input terminal.

2. The control circuit of claim 1 wherein said control circuit further includes a diode disposed between said second side of said capacitor and said first power supply terminal for permitting the capacitor to charge by said power supply and for preventing current flow from said capacitor to said first power supply terminal when voltage on said second side of said capacitor exceeds the voltage on said first power supply terminal.

3. The control circuit of claim 2 wherein said diode is a zener diode.

4. The control circuit of claim 1 wherein said control terminal of said first transistor is capable of carrying a potential and wherein said control circuit further includes means for discharging the potential on said control terminal of said first transistor when said second transistor is turned on.

5. The control circuit of claim 1 wherein said control terminal of said second transistor is capable of carrying a potential and wherein said control circuit further includes means for discharging the potential on said control terminal of said second transistor when said first transistor is turned on.

6. The control circuit of claim 1 wherein said control circuit further includes a diode disposed between said control terminal of said first transistor and said second power supply terminal.

7. The control circuit of claim 1 wherein said transistors are formed in an integrated circuit and wherein said load and said capacitor are separate from said integrated circuit.

8. The control circuit of claim 1 wherein said control circuit further includes a zener diode disposed between said first and second power supply terminals.

* * * * *